United States Patent [19]

Yamashita et al.

[11] Patent Number: 4,600,684
[45] Date of Patent: Jul. 15, 1986

[54] PROCESS FOR FORMING A NEGATIVE RESIST USING HIGH ENERGY BEAM

[75] Inventors: Yoshio Yamashita; Ryuji Kawazu, both of Tokyo, Japan

[73] Assignee: Oki Electric Industry Co., Ltd., Tokyo, Japan

[21] Appl. No.: 574,363

[22] Filed: Jan. 27, 1984

[30] Foreign Application Priority Data

Feb. 10, 1983 [JP] Japan .................. 58-19582
Mar. 31, 1983 [JP] Japan .................. 58-53674

[51] Int. Cl.$^4$ .............................. G03F 7/26
[52] U.S. Cl. ................... 430/296; 430/190; 430/325; 430/966; 430/967
[58] Field of Search ............... 430/296, 325, 190, 967, 430/966

[56] References Cited

U.S. PATENT DOCUMENTS

| | | | |
|---|---|---|---|
| 3,046,120 | 7/1962 | Schmidt et al. | 430/190 |
| 3,502,470 | 3/1970 | Delzonne et al. | 430/190 |
| 3,837,860 | 9/1974 | Roos | 430/190 |
| 4,308,368 | 12/1981 | Kubo et al. | 430/190 |
| 4,365,019 | 12/1982 | Daly et al. | 430/190 |
| 4,407,926 | 10/1983 | Stahlhofer | 430/190 |

FOREIGN PATENT DOCUMENTS 595694 2/1978 U.S.S.R. .................. 430/325

OTHER PUBLICATIONS

Berker et al., *IEEE Electron Device Letters*, vol. EDL-3, No. 11, 7/1981, pp. 281–283.
Pacansky, J., et al., *IBM J. Res. Dev.*, vol. 23, No. 1, 1/1979, pp. 42–51.
Bowden, M. J., *CRC Critical Reviews in Solid State Sciences*, 2/1979, p. 258.
Hiraoka, H. et al., *IBM Tech. Discl. Bulletin*, vol. 20, No. 5, 10/1977, p. 1922.
Hatzakis, Proceedings of the IEEE, vol. 71, No. 5, pp. 570–574, May 1983.

*Primary Examiner*—Charles L. Bowers, Jr.
*Attorney, Agent, or Firm*—Wenderoth, Lind & Ponack

[57] ABSTRACT

A negative type resist for high energy beam such as electron beam, X-rays or the like made from quinone diazide ester of an oligomer having a polymerization degree of 1-20, and a process for forming a pattern with the same type resist.

2 Claims, No Drawings

PROCESS FOR FORMING A NEGATIVE RESIST USING HIGH ENERGY BEAM

BACKGROUND OF THE INVENTION

1. Field of the Invention

This invention relates to resist materials for forming fine resist patterns by means of a high energy beam such as an electron beam, X-rays or the like and the process for forming patterns of such resist in the production of semiconductors, magnetic bubble elements, optical applied parts and the like.

2. Description of the Prior Art

Recently there have been remarkably severe demands for high integration of semiconductor devices. In connection with such demands, it is particularly required for fine work in such process, that resist patterns are formed by means of an electron beam (EB) or the like, and they are precisely transferred to a substrate in accordance with dry etching wherein ions, plasma or the like is utilized.

In this respect, as a matter of course, high resolution as well as high resistance to dry etching are required for the resist materials utilized for such fine work as described above. However, for example, heretofore well-known radiation sensitive resists will not necessarily satisfy the above described requirements. For instance, polymethyl methacrylate (hereinafter referred to simply as "PMMA") which has been known as a high resolution positive type EB resist has in sufficient dry etching resistance. Methacrylic polymers, polybutene-1-sulfone and the like which have been utilized as the other positive type resists have lower resolving power than that of PMMA and dry etching resistance equivalent to or lower than that of PMMA, so that such characteristic properties are also insufficient.

On the other hand, acrylic resists such as polyglycidyl methacrylate and the like, among negative type resists are insufficient in resistance to dry etching, as in the case of the aforesaid PMMA. Furthermore, for example, polystyrene or chloromethylated polystyrene obtained by imparting a sensitive group to polystyrene contains phenyl group(s) so that such chloromethylated polystyrene is excellent in the aforementioned dry etching resistance. On the other hand, however, these resists are crosslinking type resists so that there are disadvantages such that occurrence of scum and bridging due to swelling of the pattern cannot be avoided and like defects. Thus, it is impossible, in fact, to form a resist pattern with 0.2 $\mu$m features.

Moreover a method wherein the molecular weight of resist materials is decreased for forming fine patterns has been known in general. However, this method has a disadvantage such that the sensitivity of the resulting resist materials decreases significantly. Particularly, there is a disadvantage in that an oligomer having a molecular weight of 1,000 or less exhibits very low sensitivity so that such oligomer cannot be put to practical use.

As described above, there is strong demand in respect of resist materials having high resolving power as well as excellent dry etching resistance as described hereinbefore at present. Under these circumstances, early establishment of a process for forming fine patterns by means of such resists as mentioned above is expected.

SUMMARY OF THE INVENTION

In view of the above circumstances, the present inventors have examined and studied the problem repeatedly. As a result, it was found that when a quinone diazide ester of an oligomer containing phenyl or naphthyl group was utilized as a resist material, a film of the material was irradiated with a high energy beam, and the film thus irradiated was developed by the use of a solution containing acetic ester or alkyl ketone, a fine resist pattern having high resolution as well as excellent dry etching resistance could be formed.

Furthermore it was ascertained that when a polymer involving the aforementioned quinone diazide was employed as a resist, the resist was irradiated with high energy beam, and the irradiated resist was developed by using an acetic ester or alkyl ketone solution containing 0.05% by weight or more of water, an excellent fine resist pattern could be obtained as in the above case.

DETAILED DESCRIPTION OF THE INVENTION

The present invention will be described in detail hereinbelow.

The resist film according to the present invention is made from a quinone diazide ester obtained by combining an oligomer with a quinone diazide and which is usually in the form of a sulfonic ester or carboxylic ester. Specific examples of quinone diazide include benzoquinone diazide and naphthoquinone diazide, and it is considered that both the compounds have substantially equal advantageous effects. From the viewpoint of plasma resistance, particularly it is preferable that the aforementioned oligomer is one containing a phenyl group such as a novolak resin and the like. As described hereinafter, however, it is necessary for dissolving such novolak resin in acetic ester or the like that there be a limitation as to molecular weight of the novolak resin and the like. For instance, in the novolak having a molecular weight of 5,000 or more, patterning thereof becomes difficult and accordingly, such novolak is not suitable.

Namely, as a molecular weight of the aforesaid oligomer, 2,000 or less is preferable, and it is required that a degree of polymerization be within a range of 1–20.

Next, the developer used in the present invention is required to selectively dissolve a resist which has not yet been irradiated. Examples of such developer include specifically acetic esters such as isoamyl acetate, isopropyl acetate, ethyl acetate, sec-butyl acetate and the like as well as alkyl ketones containing alkyl ketone such as methyl isobutyl ketone, isoamyl methyl ketone, isobutyl ethyl ketone or the like.

In addition, mixed solvents obtained by mixing cyclohexane, isopropyl alcohol, ethanol or the like with the aforesaid acetic esters or alkyl ketones may also be employed, but it is preferable that the mixed solvent contains 30% by volume or more of the aforesaid acetic ester or alkyl ketone for obtaining favorable patterns.

According to the present invention, a high energy beam such as an electron beam, X-rays or the like is utilized for the pattern formation without substantial exception.

Next, as apparent from the undermentioned examples, such a resist pattern without any accompanying cracking after the development can be obtained by allowing a prescribed amount of water to be present in the developer to be used in the present invention. In the case where a developer containing no water is employed, the cracks as mentioned above are liable to appear, especially, on the periphery of a window pattern. Besides, the finer the window pattern or the thicker the resist prepared, the more remarkable the cracks observed.

Since etching of the substrate is significantly adversely affected by the cracks thus produced, it is required to suppress such occurrence of cracks as much as possible. As a measure for such suppression, it may be considered that a resist thickness is permitted to be thinner, but such a thin resist is not practical, if dry etching of the substrate is taken into consideration. In this respect, according to the present invention, occurrence of the aforesaid cracks can be prevented by merely adding water to a developer so that such method is extremely effective from the industrial standpoint.

It is sufficient for the effect of preventing cracks that loadings of the aforementioned water are 0.05% by weight with respect to a developer. Particularly, in case of a resist thickness of 1 $\mu$m, it is preferable that an amount of the water is 0.1% by weight or more. Of course, the upper limit of such addition is determined by the solubility of water in a developer, and for example, it is 0.25% at 15° C. in case of isoamyl acetate.

EXAMPLE 1

The Naphthoquinone 1,2-diazide-5-sulphonic ester of novolak resin having a polymerization degree of 1-10 (hereinafter referred to simply as "LMR") was employed.

The LMR was dissolved in methyl cellosolve acetate, the resulting solution was applied to a silicon substrate with a thickness of 0.8 $\mu$m, the substrate thus applied was subjected to pre-baking at 80° C. for 30 minutes, and then the substrate so pre-baked was patterned by means of electron beam with a dose of 20 kv and 40 $\mu$C/cm$^2$. Thereafter development was carried out for 30 seconds by using isoamyl acetate. As a result, 0.2 $\mu$m line and 0.2 $\mu$m space patterns were obtained in a favorable shape. Furthermore, the pattern after development was easily removed by a solvent such as acetone or the like.

EXAMPLE 2

A film of LMR was formed in accordance with Example 1. Dry etching resistance of the resulting LMR film was examined by oxygen plasma. A plasma etching device of parallel plate type was used to carry out etching for 15 minutes under conditions of 0.08 W/cm$^2$ output density, 20 SCCM O$_2$ gas flow rate and 50 Pa gas pressure, and an etching amount was measured by Taly Step (Trade name of film thickness measuring device manufactured by Taylor Hobson Co.) so that a value of 50 nm was obtained. For the comparison, tests were repeated in respect of the aforesaid PMMA and Az-1350J (manufactured by Shipley Co.) under the same conditions as those of the above test, and as a result etching amounts of 200 nm and 100 nm were obtained, respectively.

EXAMPLE 3

The LMR exposed to electron beam in accordance with Example 1 was developed by using a mixture consisting of 80% by volume of isopropyl acetate and 20% by volume of cyclohexane. As a result, line-and-space (hereinafter referred to simply "L/S") patterns of 0.2 $\mu$m were obtained.

EXAMPLE 4

The LMR exposed to an electron beam in accordance Example 1 was developed by utilizing isoamyl methyl ketone. As a result, L/S patterns of 0.2 $\mu$m were obtained.

EXAMPLE 5

The LMR exposed to electron beam in accordance with Example 1 was developed by using a mixture consisting of 50% by volume of methyl isobutyl ketone and 50% by volume of isopropyl alcohol. As a result, L/S patterns of 0.2 $\mu$m were obtained.

COMPARATIVE EXAMPLE 1

The LMR prepared by in same manner as Example 1 was subjected to ultraviolet exposure through a mask for 30 seconds by means of a mask aligner provided with 250 W mercury-arc lamp in accordance with the contact exposure method, and the LMR thus exposed was developed by using isoamyl acetate. As a result, no pattern of the mask was transferred and the whole surface thereof was dissolved.

COMPARATIVE EXAMPLE 2

LMR was used to effect exposure in accordance with Example 1, and the LMR thus exposed was developed by utilizing the aforementioned exclusive developer Az-1350J for 60 seconds. As a result, no pattern was formed by the exposure.

EXAMPLE 6

The same procedure as that of Example 1 was performed except that a naphthoquinone diazide sulfonic ester of an oligomer prepared from hydroxystyrene was employed. The resulting material was subjected to EB exposure (with a dose of 100 $\mu$C/cm$^2$) and was developed by employing isoamyl acetate. As a result, L/S patterns of 0.5 $\mu$m were obtained.

As described in the above examples, it is apparent that LMR is a negative type with respect to EB, and the LMR has high resolution as well as remarkably high dry etching resistance. The reason for this may be as follows. Namely, it is substantially presumed that insoluble groups have been produced in the acetic ester obtained by decomposition of quinone diazide, due to the LMR with EB irradiation. In other words, although the LMR is a negative type resist, its pattern formation is not based on a crosslinking reaction, but rather, it utilizes a structural change due to the decomposition of the molecule so that there is no production of scum or bridging as mentioned above and high resolving power is obtained.

Furthermore, since LMR is an oligomer, the molecular weight of which is 1,000 or less, it may be considered that this fact also contributes significantly to the aforementioned high resolving power, and at the same time such LMR involves many phenyl groups so that its plasma resistance is also remarkably elevated.

Although the aforesaid quinone diazide group is a light sensitive group, as is apparent from Comparative Example 1, patterning cannot be carried out by means of acetic ester in case of the decomposition due to optical reaction, nor can the patterning with an alkaline developer be effected by means of decomposition with EB irradiation as in Comparative Example 2. That is, it may be considered that the decomposition product derived from the aforesaid LMR with ultraviolet irradiation differs clearly from the decomposition product with EB irradiation. Thus, only after the EB irradiation according to the present invention, differences in solubility between the part which has been irradiated and the part which has not yet been irradiated are observed by utilizing acetic ester or alkyl ketone system solvent, so that the patterning becomes possible.

Next, resolving power and plasma resistance of the aforesaid LMR according to the present invention were compared with those of typical resists, PGMA, CMS and PMMA which have already been known and described hereinbefore, and the results thereof will be indicated in the following Table. In the Table, the resolving power was evaluated by the use of 0.3 $\mu m$ L/S (line-and-space) and 0.3 $\mu mS$ (space), a plane parallel plate type plasma etching device was utilized in respect of plasma resistance, and etching was effected by means of $O_2$ plasma (RF power: 80 $mW/cm^2$, $O_2$:50 Pa—20 SccM) so that a substantially equal etching amount of a sample to that of Az-1350J was represented by (o) good, whilst a two or more times larger etching amount than that of Az-1350J was represented by (x) poor.

|  | Resolving power | | Plasma resistance |
|---|---|---|---|
|  | 0.3 $\mu mL/S$ | 0.3 $\mu mS$ |  |
| PGMA (polyglycidyl methacrylate) | x | x | x |
| CMS | △ | x | o |
| PMMA | o | o | x |
| LMR | o | o | o |

As is understood from the above Table, LMR was only the material which could sufficiently resolve 0.3 $\mu mL/S$ and 0.3 $\mu mS$, besides possessing favorable plasma resistance.

EXAMPLE 7

Naphthoquinone 1,2-diazide-5-sulfonic ester of novolak resin having a polymerization degree of 1–10 was dissolved in methyl cellosolve acetate, and the resulting solution was applied to a silicon substrate with a thickness of 0.8 $\mu m$ in accordance with the spin coating method.

Then, the substrate thus applied was pre-baked at 60° C. for 30 minutes in nitrogen atmosphere, and thereafter the substrate so pre-baked was patterned by means of electron beam with a dose of 20 kv and 30 $\mu C/cm^2$. Then, development was carried out in respect of such substrate patterned by utilizing isoamyl acetate solution containing 0.15% of water. As a result, a window pattern of 0.3 $\mu m$ square could be formed with a favorable shape, besides no production of cracks was observed on the resulting patterned surface.

COMPARATIVE EXAMPLE 3

Samples patterned by the same manner as that of Example 7 were employed, and development was carried out by utilizing isoamyl acetate. As a result, line-and-space patterns of 0.3 $\mu m$ and line patterns of 0.2 $\mu m$ were favorably obtained, but a number of very small crack-like flaws were found on the periphery of a window pattern having 0.3 $\mu m$ square, when such pattern was observed in detail by means of a scanning type electron microscope. On the other hand, such cracks were not observed in respect of a window pattern having 0.7 $\mu m$ square. Furthermore the same experiment as described above was carried out in respect of a pattern wherein the aforesaid resist was formed with a thickness of 0.4 $\mu m$ and in this case, no crack was observed on even the periphery of such a window pattern of 0.3 $\mu m$ square as mentioned above.

EXAMPLE 8

A sample being subjected to patterning in accordance with the same manner as that of Example 7 was employed and developed by means of a mixed solution consisting of 5 parts of methyl isobutyl ketone containing 0.2% of water and 1 part of cyclohexane. As a result, a window pattern of 0.5 $\mu m$ square could favorably be formed.

COMPARATIVE EXAMPLE 4

A sample patterned by the same manner as that of Example 7 was developed by using a solution consisting of 5 parts of methyl isobutyl ketone and 1 part of cyclohexane. As a result, cracks were observed on the periphery of a window pattern of 0.5 $\mu m$ square.

EXAMPLE 9

EB exposure (with a dose of 50 $\mu C/cm^2$) effected in accordance with the same manner as that of Example 7 except that naphthoquinone diazide carboxylic ester of an oligomer prepared from hydroxystyrene was employed. The material thus exposed was developed by using isopropyl acetate containing 0.15% of water, so that a window pattern of 0.5 $\mu m$ square was favorably obtained.

COMPARATIVE EXAMPLE 5

A sample exposed by the same manner with that of Example 9 was used, and the so exposed sample was developed by the use of isopropyl acetate. As a result, cracks were observed on the periphery of a window pattern of 0.5 $\mu m$ square.

Accordingly, a process for forming patterns of a high energy beam negative type resist according to the present invention is very suitable for applying it to the production of high-density semiconductor parts, semiconductor devices, magnetic bubble elements and the like.

What is claimed is:

1. A process for forming a pattern on a high energy beam negative type resist comprising the steps of forming a film of a negative type resist consisting essentially of a quinone diazide sulfonic ester of a novolak resin having a polymerization degree of 1–10 on a substrate, selectively irradiating said film with a high energy beam from the group consisting of electron beam and X-ray radiation, and developing the film thus irradiated by using an organic solvent which is an alkyl ketone or an acetic ester to remove portions of the film which have not been selectively irradiated.

2. The process according to claim 1 wherein the organic solvent further contains at least 0.05% by weight of water.

* * * * *